(12) United States Patent
Park et al.

(10) Patent No.: US 6,949,960 B2
(45) Date of Patent: Sep. 27, 2005

(54) SEMICONDUCTOR INTEGRATED CIRCUIT COMPRISING FUNCTIONAL MODES

(75) Inventors: Chul-Sung Park, Seoul (KR);
Hyang-Ja Yang, Suwon-Shi (KR);
Hong-Kyun Kim, Sungnam-shi (KR);
Yong-Hwan Noh, Suwon-shi (KR)

(73) Assignee: Samsung Electronics, Co., Ltd., Suwon (KR)

( * ) Notice: Subject to any disclaimer, the term of this patent is extended or adjusted under 35 U.S.C. 154(b) by 0 days.

(21) Appl. No.: 10/635,253

(22) Filed: Aug. 6, 2003

(65) Prior Publication Data

US 2004/0032915 A1 Feb. 19, 2004

(30) Foreign Application Priority Data

Aug. 13, 2002 (KR) .............................. 10-2002-0047870

(51) Int. Cl.[7] .............................................. G01R 23/02
(52) U.S. Cl. ......................................... 327/47; 327/46
(58) Field of Search ...................... 327/47–49, 44–46; 377/28, 33, 51

(56) References Cited

U.S. PATENT DOCUMENTS 3,943,382 A * 3/1976 Hermansdorfer et al. ..... 327/49
3,993,984 A * 11/1976 Penrod ........................ 340/658
4,468,796 A * 8/1984 Suga ............................ 377/28
4,839,834 A * 6/1989 Omae et al. ................. 702/147
5,519,325 A * 5/1996 Park ............................ 324/607

FOREIGN PATENT DOCUMENTS

| JP | 58123227 | 7/1983 |
| JP | 06111580 | 4/1994 |
| JP | 09200014 | 7/1997 |

* cited by examiner

Primary Examiner—Minh Nguyen
(74) Attorney, Agent, or Firm—F. Chau & Associates, LLC

(57) ABSTRACT

An integrated circuit device includes a pin for receiving a DC voltage component signal. The device includes a signal source for applying an AC signal to the pin, a buffer for converting the AC signal into a digital signal, and a digital detector for detecting a frequency of the digital signal and outputting a predetermined detection signal. The predetermined detection signal is activated when the frequency of the digital signal is greater than or equal to a predetermined frequency. The predetermined detection signal is used as a signal for setting predetermined functional modes. The device further includes registers or a differential amplifier and a decoder for generating a plurality of functional mode signals.

14 Claims, 8 Drawing Sheets

SEMICONDUCTOR INTEGRATED CIRCUIT COMPRISING FUNCTIONAL MODES

BACKGROUND OF THE INVENTION

1. Field of the Invention

The present invention relates to a semiconductor integrated circuit, and more particularly, to a semiconductor integrated circuit comprising functional modes.

2. Description of the Related Art

Semiconductor integrated circuits employ functional modes in which device characteristic analysis and reliability verification are performed. Further, by using functional modes a test time and/or a burn-in test time can be reduced in a packaging process. The analysis, verification, and test functions are performed through joint test action group (JTAG) pins available to designers, or function command cells. However, a designer cannot set a desired function in a package without a pin and control code being made available during the packaging process.

SUMMARY OF THE INVENTION

According to an embodiment of the present invention, a semiconductor integrated circuit with functional modes substantially obviates one or more limitations and disadvantages of the related art.

It is an object of the present invention to provide a semiconductor integrated circuit with functional modes in which designers can set a desired function without a dedicated pin.

It is another object of the present invention to provide a semiconductor integrated circuit with functional modes in which a functional mode can be set easily and flexibly.

Additional advantages, objects, and features of the invention will be set forth in part in the description which follows. The advantages, objects, and features of the present invention will become apparent to those having ordinary skill in the art upon examination of the following or may be learned from practice of the invention. The objectives and other advantages of the invention may be realized and attained by the structure particularly pointed out in the written description, including the drawings, and claims.

According to an embodiment of the present invention, an integrated circuit device comprises a pin that receives a direct current (DC) voltage component signal. The device includes a signal source for applying an alternating current (AC) signal to the pin, a buffer for converting the AC signal into a digital signal, and a digital detector for detecting a frequency of the digital signal and outputting a predetermined detection signal.

The predetermined detection signal is activated when the frequency of the digital signal is greater than or equal to a predetermined frequency. The predetermined detection signal is used as a signal for setting a predetermined functional mode.

To generate a plurality of functional mode signals, the device according to the present invention further includes a register chain for generating successive transfer signals according to the digital signal in response to a clock signal, and a decoder for generating functional mode signals according to the transfer signals in response to the predetermined detection signal. The decoder generates the functional mode signals through a logical combination of the transfer signals.

According to an embodiment of the present invention, an integrated circuit device comprises a pin that receives a DC voltage component signal. The device comprises differential amplifiers for comparing a DC voltage component signal applied to the pin with a reference voltages and generating differential amplification signals. The device further comprises a decoder for generating at least one functional mode signal according to a logical combination of the differential amplification signals. The reference voltages are between a lowest voltage level of a plurality of high level voltages of the integrated circuit device and a highest voltage level of a plurality of low level voltages of the integrated circuit device.

According to an embodiment of the present invention, an integrated circuit device comprising a pin for receiving a direct current voltage component signal, the device comprises a pin for receiving an alternating current signal, a buffer coupled to the pin for converting the alternating current signal into a digital signal, and a digital detector coupled to the buffer for detecting a frequency of the digital signal and outputting a functional mode signal for setting a mode of the device. The digital detector comprises a plurality of inverter stages responsive to a reference signal. Each inverter stage comprises a PMOS transistor and an NMOS transistor coupled in series to the PMOS transistor, the NMOS transistor having a size smaller than a size of the PMOS transistor. The functional mode signal depends on the size of the NMOS transistor for pull-down. The functional mode signal is activated when the frequency of the digital signal is greater than a predetermined minimum frequency. The predetermined minimum frequency depends on a size of an NMOS transistor relative to a PMOS transistor in an inverter stage of the digital detector.

The semiconductor integrated circuit device is an SRAM device. The SRAM device is, for example, a 100-pin low profile quad flat package (100-pin LPQFP) type SRAM, a no-turnaround RAM (NtRAM), and a synchronous pipelined burst (SPB) type SRAM having a DC pin to set operation modes.

The DC pins employed in the semiconductor integrated circuit device comprise a mode setting pin, or pad, for logically setting a level to be a high level or a low level, a power supply voltage VDD pin, and a ground voltage (GND) pin. The mode setting pin is exemplified by the pin LBOB that is set to be a high logic level ("1": linear manner) or a low logic level ("0": interactive manner) to determine burst data processing order in 100-pin LQFP type SRAM. The mode setting pin can be used in various embodiments. However, it should be noted that the power supply voltage pin and ground voltage pin can be used where the pins do not affect on the supply of electric power.

It is to be understood that both the foregoing general description and the following detailed description of the present invention are exemplary and explanatory, and are intended to provide further explanation of the invention.

BRIEF DESCRIPTION OF THE DRAWINGS

Preferred embodiments of the present invention will be described below in more detail, with reference to the accompanying drawings.

Wherever possible, the same reference numbers will be used throughout the drawings to refer to the same or like parts.

DETAILED DESCRIPTION OF PREFERRED EMBODIMENTS

Reference will now be made in detail to preferred embodiments of the present invention, examples of which are illustrated in the accompanying drawings. However, the present invention is not limited to the embodiments illustrated, and the embodiments are rather introduced to provide easy and complete understanding of the scope and spirit of the present invention.

Figure 1:
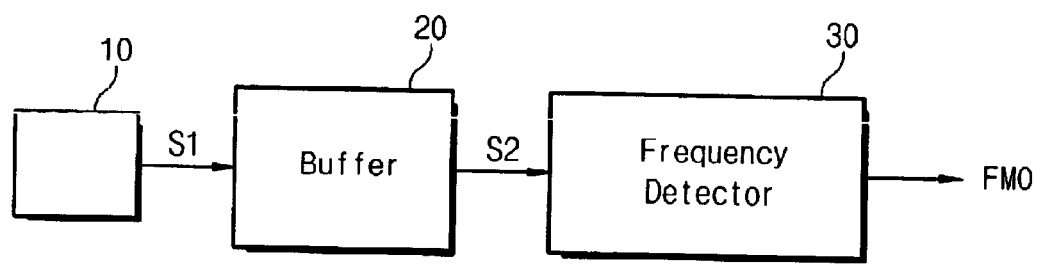
FIG. 1 is a block diagram of an operation mode setting circuit according to an embodiment of the present invention.
Figure 3:
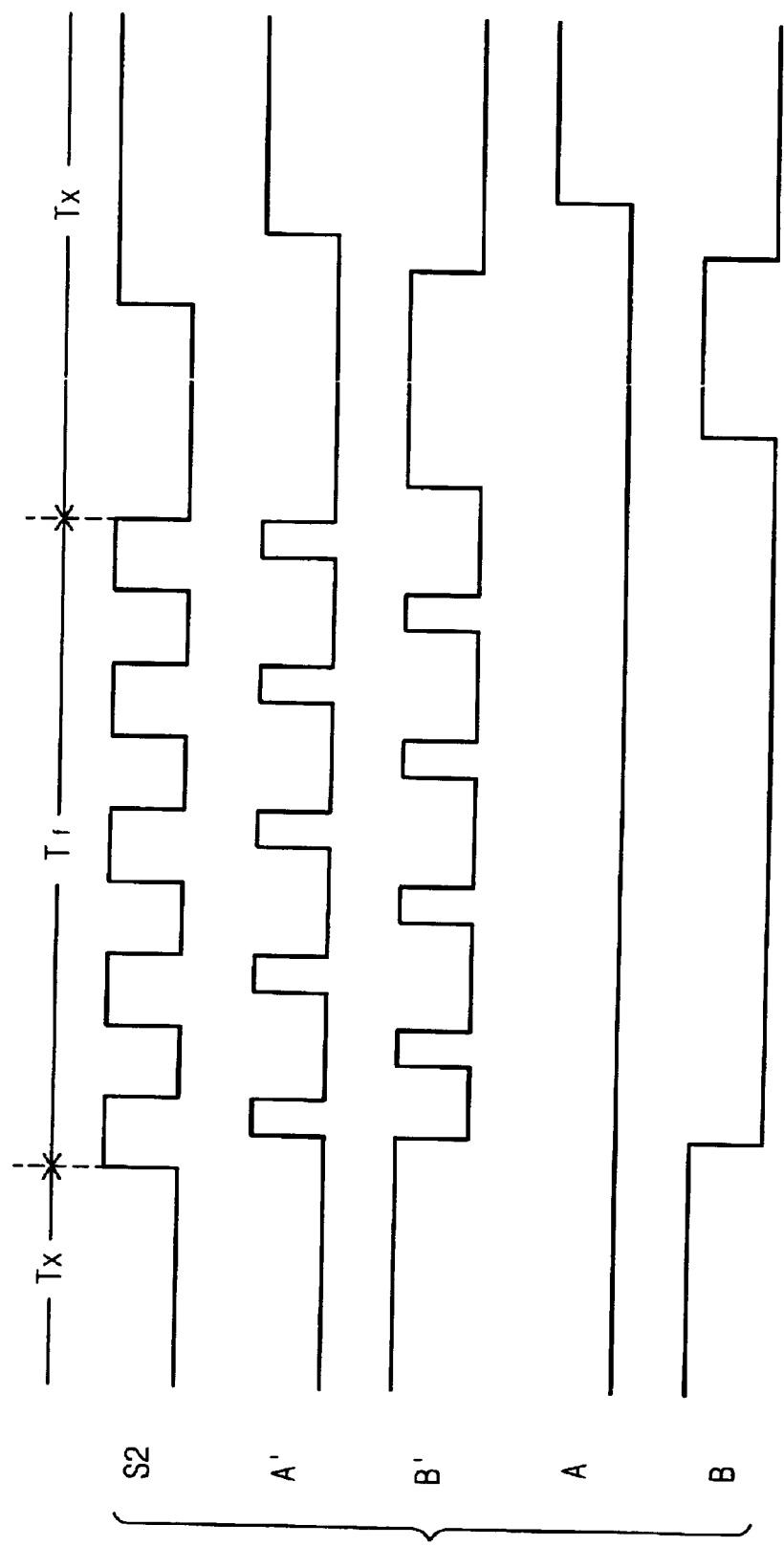
FIG. 3 illustrates a waveform representing input/output characteristic of the frequency detector shown in FIGS. 1 or 2.

Referring to FIG. 1, in a functional mode setting circuit comprises a pin or pad 10 connected to a frequency detector 30 through a buffer 20. An AC signal S1, input through the pin 10, is converted into a digital signal S2 by the buffer 20 having a complementary metal-oxide-semiconductor (CMOS) logic. The digital signal S2 is applied to the frequency detector 30. As shown in FIG. 3, the frequency detector 30 outputs a functional mode signal FM0 if the digital signal S2 oscillates between a high level and a low level for a predetermined duration.

Figure 2:
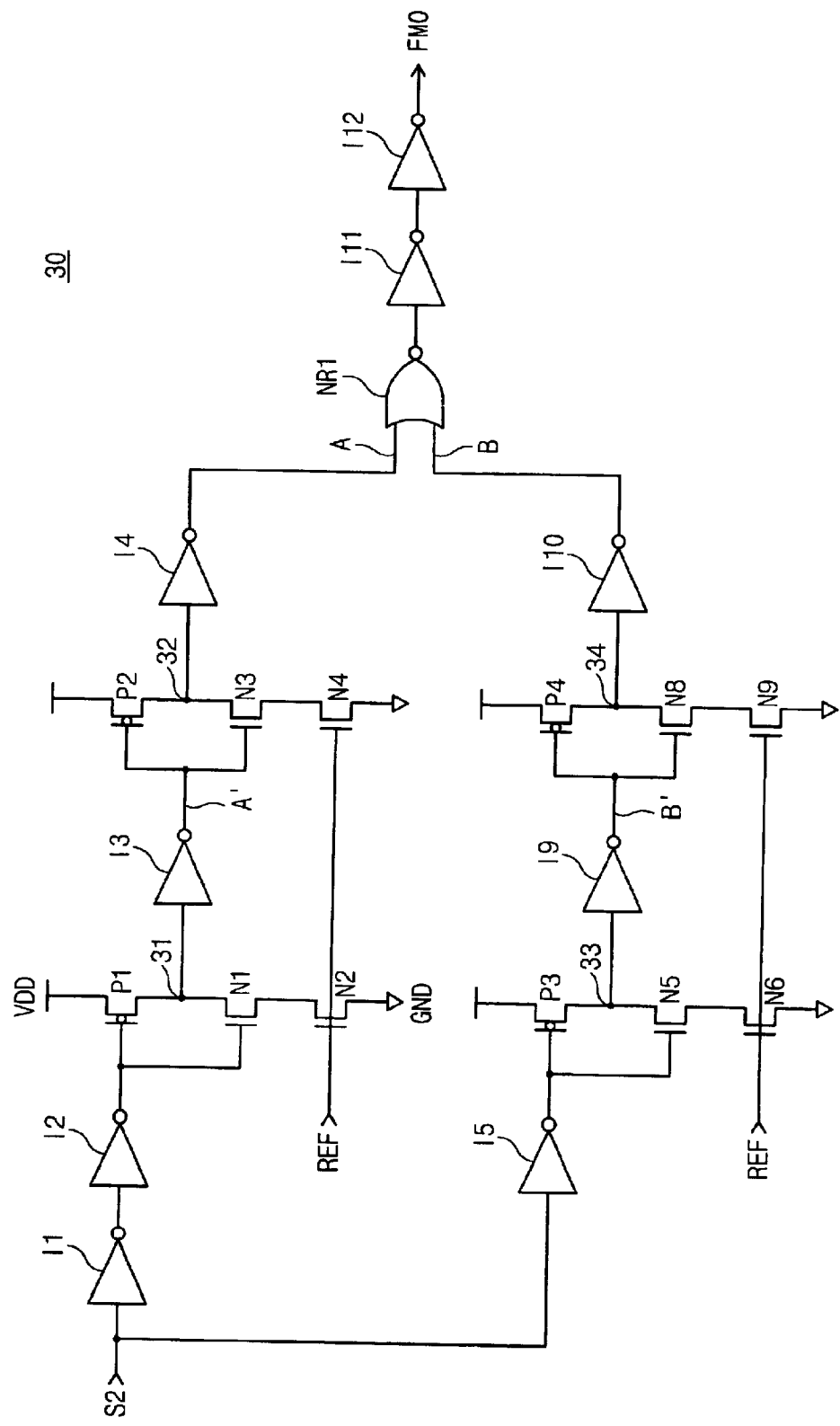
FIG. 2 is a circuit showing an embodiment of a frequency detector shown in FIG. 1.

The frequency detector 30 is configured as shown in FIG. 2. The CMOS digital signal S2 provided from the buffer 20 is applied to the gates of a PMOS transistor P1 and an NMOS transistor N1 through inverters I1 and I2 connected in series. The PMOS transistor P1 and the NMOS transistor N1 are connected to each other in series between a power supply voltage VDD and an NMOS transistor N2. The NMOS transistor N2 is connected to the NMOS transistor N1 and a ground voltage GND. The gate of the NMOS transistor N2 is connected to a reference signal REF. When the reference signal REF is activated, the PMOS transistor P1 and the NMOS transistor N1 operate. The reference signal REF is at such a voltage level as to turn the NMOS transistor N2 on. Node 31 is connected to the drain of the PMOS transistor P1 and the source of the NMOS transistor N1, and is connected to the gates of a PMOS transistor P2 and an NMOS transistor N3 through an inverter I3. The NMOS transistor N3 is connected to the ground voltage GND through an NMOS transistor N4. The gate of the NMOS transistor N4 and the gate of the NMOS transistor N2 are connected to the reference signal REF. Similarly, the PMOS transistor P2 and the NMOS transistor N3 act as an inverter when the NMOS transistor N4 is turned on in response to the reference signal REF. Node 32 is connected to the drain of the PMOS transistor P2 and the source of the NMOS transistor N3, and is connected to the input of a NOR gate NR1 through an inverter I4.

The digital signal S2 is applied to the gates of a PMOS transistor P3 and an NMOS transistor N5 through an inverter I5. The PMOS transistor P3 and the NMOS transistor N5 are connected to each other in series between the power supply voltage VDD and an NMOS transistor N6. The NMOS transistor N6 is connected to the NMOS transistor N5 and the ground voltage GND. The gate of the NMOS transistor N6 is connected to the reference voltage REF. When the reference signal REF is activated, the PMOS transistor P3 and the NMOS transistor N5 act as an inverter. Node 33 is connected to the drain of the PMOS transistor P3 and the source of the NMOS transistor N5, and is connected to the gates of a PMOS transistor P4 and an NMOS transistor N8 through an inverter I9. The NMOS transistor N8 is connected to the ground voltage GND through an NMOS transistor N9. The gate of the NMOS transistor N9 and the gate of the NMOS transistor N6 are connected to the reference signal REF. Similarly, the PMOS transistor P4 and the NMOS transistor N8 act as an inverter in response to the reference signal REF when the NMOS transistor N9 is turned on. Node 34 connected to the drain of the PMOS transistor P4 and the source of the NMOS transistor N8, and is connected to the input of the NOR gate NR1 through an inverter I10.

NMOS transistors N1 to N9 are smaller in size than other MOS transistors (for example, PMOS transistors P1 to P4). Accordingly, the NMOS transistors N1 to N9 have a low current driving power. The operation of the NMOS transistors will be described in detail with reference to FIG. 3. Referring to FIG. 2, two NMOS transistors (for example, N1 and N2) are connected to each other in series in each inverter stage, but it should be noted that each inverter stage can be configured with one NMOS transistor, for example, N1, connected to a PMOS transistor, for example, P1.

The NOR gate NR1 receives the outputs of the inverters I4 and I10 and outputs a functional mode signal FM0 through inverters I11 and I12 connected in series.

Referring to FIG. 3, when the signal S2 is fixed at a high level or a low level (Tx), the functional mode FM0 is generated at a low level. When the signal S2 is fixed at high level, nodes 32 and 33 go to a low level and a high level respectively. As the outputs A and B of the inverters I4 and I10 go to a high level and a low level respectively, the output of the NOR gate NR1 goes to a low level and the functional mode signal FM0 goes to a low level. When the signal S2 is fixed at a low level, the functional mode signal FM0 is fixed at a low level as the outputs of the inverters I4 and I10 go to a low level and a high level respectively.

However, the digital signal S2 is responsive to an oscillation of the AC signal S1 applied to the pin 10 with at least a predetermined frequency(Tf), causing the functional mode signal FM0 to be activated to a high level. As described above, if the signal S2 oscillates between a high level and a low level with at least a predetermined frequency (Tf), the pulse width of the high level of the output A' of the inverter I3 is short even though S2 is at a high level since the current driving power of the NMOS transistors N1 and N2 is small. The NMOS transistors N1 and N2 with the low current driving power react slowly to a signal having a high level. Similarly, since each of the NMOS transistors N3 and N4 in a next stage has a low current driving power, the low level response to shortened high level pulse components does not appear at the node 32. As a result, at the input A of the NOR gate NR1, only a low level signal appears for the duration Tf in which S2 oscillates with at least a predetermined frequency. In addition, on the path from inverter I5 to the input B of the NOR gate NR1, the pulse width of the high level portions of the signal S2 becomes shorter and only a low level signal appears at the input B according to the same process. As a result, for example, the functional mode signal FM0 is maintained to be high level while the signal S2 oscillates with at least a predetermined frequency (Tf). The functional mode signal FM0 detected to be at a high level during the duration Tf drives predetermined inner circuits of an integrated circuit device to perform a test operation and the like. If the signal S2, or S1, oscillates with at least a predetermined frequency, activation of the functional mode signal FM0, e.g., FM0 has a high level, depends on the size of the NMOS transistors N1 to N9 for pull-down. In addition, as shown in FIG. 2, it should be noted that the high level pulse width can be shortened.

On the other hand, when the signal S2 oscillates with at most a predetermined frequency, the functional mode signal FM0 also oscillates in response to the signal S2. However, the frequency of the signal S2 may not be used.

The circuit configuration and input/output characteristics of the frequency detector 30 shown in FIGS. 2 and 3 are used in an embodiment to be described.

Figure 4:
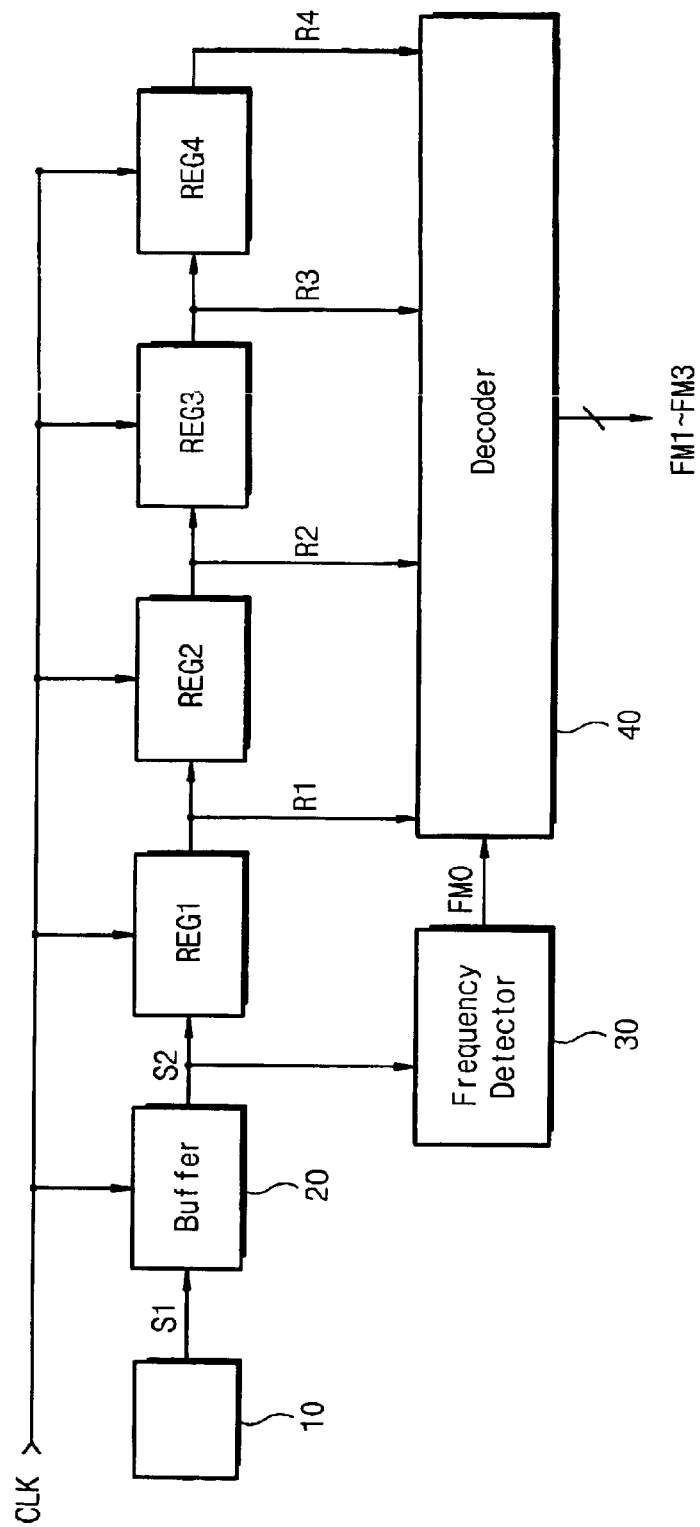
FIG. 4 is a block diagram of an operation mode setting circuit according to an embodiment of the present invention.

According to an embodiment of the present invention, the functional mode setting circuit shown in FIG. 4 uses the configuration shown in FIG. 1 to generate a plurality of functional mode signals. Referring to FIG. 4, CMOS digital signal S2 output from a buffer 20 is applied to a frequency detector 30 and transferred to a register chain comprising registers REG1 to REG4 connected in series. The registers REG1 to REG4 send respective outputs R1 to R4 to a decoder 40 in response to a clock signal CLK that has a predetermined frequency and a predetermined synchronous period. Whenever the clock signal CLK passes one period, the signal S2 passes each register stage. Each register is used in, for example, a general delay loop and a general phase loop. Each register includes a latch comprising a pair of inverters and a transfer gates turned on or off in response to the clock signal CLK.

As mentioned above with respect to FIG. 3, a frequency detector 30 generates a functional mode signal FM0 having a high level when a signal S2 oscillates with at least a predetermined frequency, e.g., it represents that the signal input state to set a functional mode is valid. In FIG. 4, the signal FM0 is used in controlling the decoder 40. The decoder 40 receives transfer signals R1 to R4 from registers REG1 to REG4 and generates functional mode signals FM1 to FM3 while the signal FM0 is at a high level.

In FIG. 4, there are four registers and three functional mode signals but the number of function mode signals can depend on the desired functions.

Figure 5:
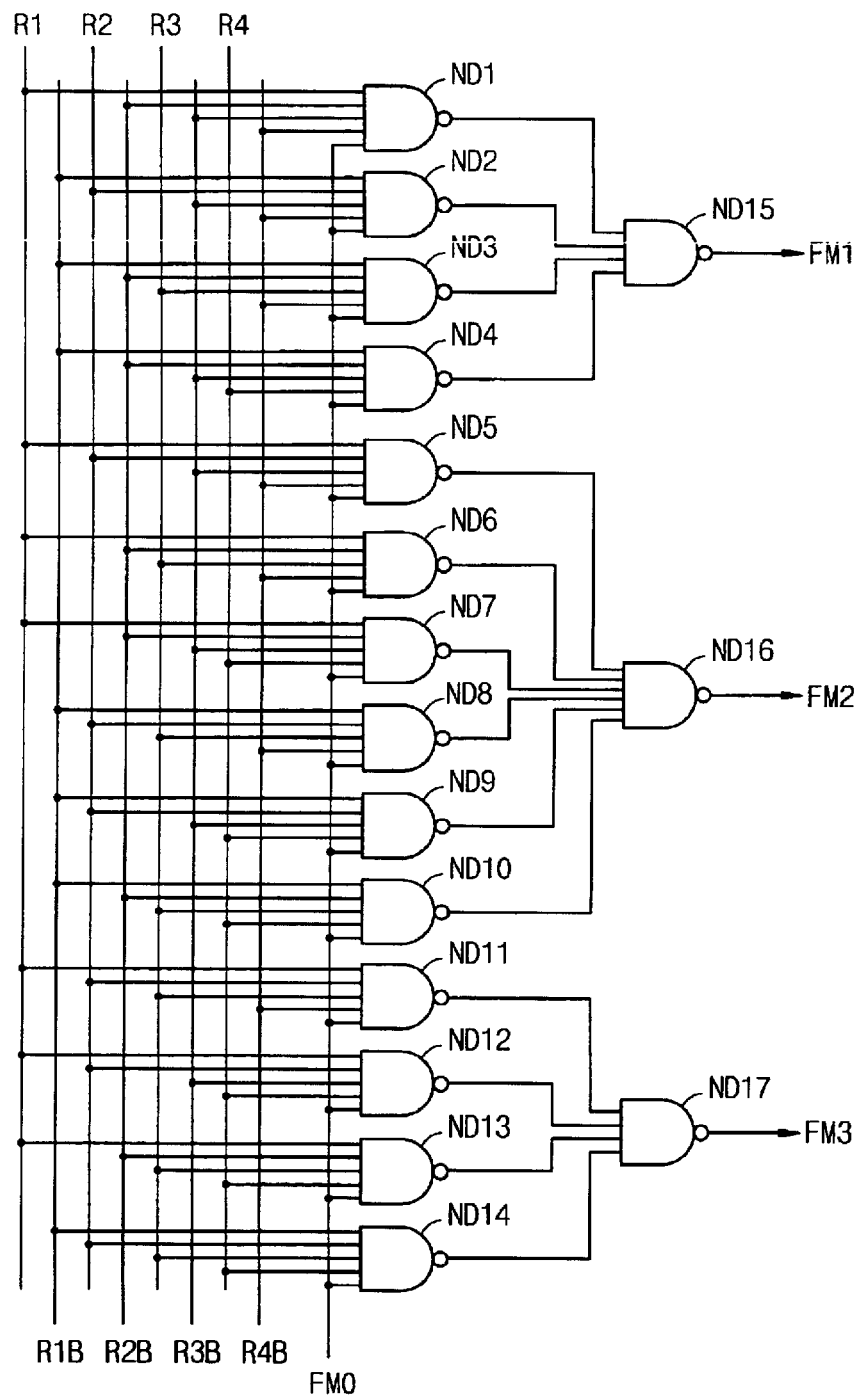
FIG. 5 is a diagram illustrating a circuit of a decoder shown in FIG. 4.

Referring to FIG. 5, a decoder 40 comprises NAND gates ND1 to ND17 for responding to a combination of the register transfer signals R1 to R4. Methods for generating the function mode signal according to the combinations of R1 to R4 can vary. According to an embodiment of the present invention, the functional mode signal FM1 is activated when one of the transfer signals R1 to R4 has a high level. The functional mode signal FM2 is activated when two of the transfer signals R1 to R4 have a high level. The functional mode signal FM3 is activated when three of the transfer signals R1 to R4 have a high level. The signals R1B to R4B are inverse logic signals of the transfer signals R1 to R4.

The NAND gate ND1 receives R1, R2B, R3B, and R4B. The NAND gate ND2 receives R1B, R2, R3B, and R4B. The NAND gate ND3 receives R1B, R2B, R3, and R4B. The NAND gate ND4 receives R1B, R2B, R3B, and R4. The outputs of the NAND gates ND1 to ND4 are input to the NAND gate ND15. The NAND gate ND15 generates the functional mode signal FM1. Since the other inverse logic signals remain at a high level while one of the transfer signals R1 to R4 is at a high level, one of the outputs of the NAND gates ND1 to ND4 goes to a low level, and the NAND gate ND15 generates the activated functional mode signal FM1 having a high level.

The NAND gate ND6 receives R1, R2B, R3, and R4B. The NAND gate ND7 receives R1, R2B, R3B, and R4. The NAND gate ND8 receives R1B, R2, R3, and R4B. The NAND gate ND9 receives R1B, R2, R3B, and R4. The NAND gate ND10 receives R1B, R2B, R3, and R4. The outputs of the NAND gates ND5 to ND10 are input to the NAND gate ND16. The NAND gate ND16 generates the functional mode signal FM2. Since the other inverse logic signals remain at a high level while two of the transfer signals R1 to R4 are at a high level, one of the outputs of the NAND gates ND5 to ND10 goes to a low level, and the NAND gate ND16 generates the activated functional mode signal FM2 of a high level.

The NAND gate ND11 receives R1, R2, R3 and R4B. The NAND gate ND12 receives R1, R2, R3B, and R4. The NAND gate ND13 receives R1, R2B, R3, and R4. The NAND gate ND14 receives R1B, R2, R3, and R4. The outputs of the NAND gates ND11 to ND14 are inputted to the NAND gate ND17. The NAND gate ND17 generates the functional mode signal FM3. Since the other inverse logic signals remain at a high level while three of the transfer signals R1 to R4 are at a high level, one of the outputs of the NAND gates ND11 to ND14 goes to a low level, and the NAND gate ND17 generates the activated functional mode signal FM3 of a high level.

Figure 6:
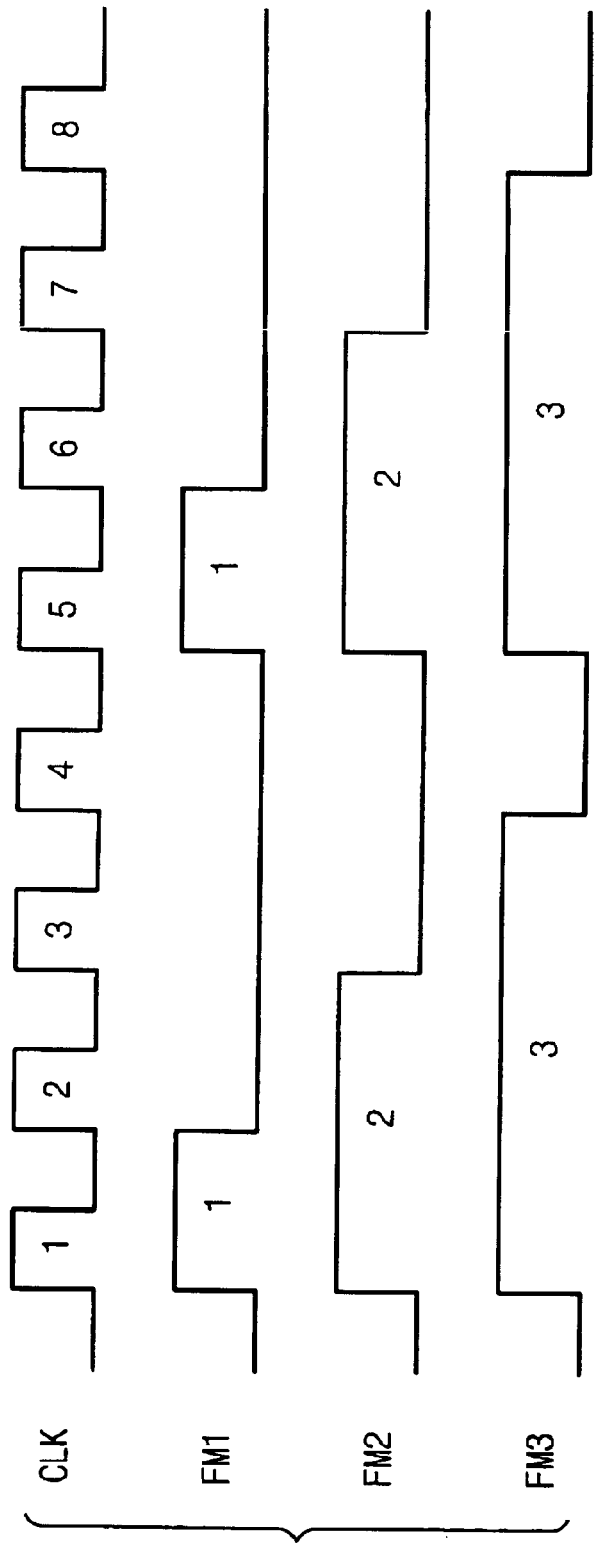
FIG. 6 illustrates waveforms showing output characteristic of the decoder shown in FIG. 5.

Referring to the waveform diagram shown in FIG. 6, the functional mode signal FM1 generated by the decoder 40 is activated every four cycles of clock signal CLK when one of the transfer signals R1 to R4 is at a high level. The functional mode signal FM2 is activated every four cycles of clock signal CLK when two of the transfer signals R1 to R4 are at a high level. The functional mode signal FM3 is activated every four cycles of clock signal CLK when three of the transfer signals R1 to R4 are at a high level.

Figure 7:
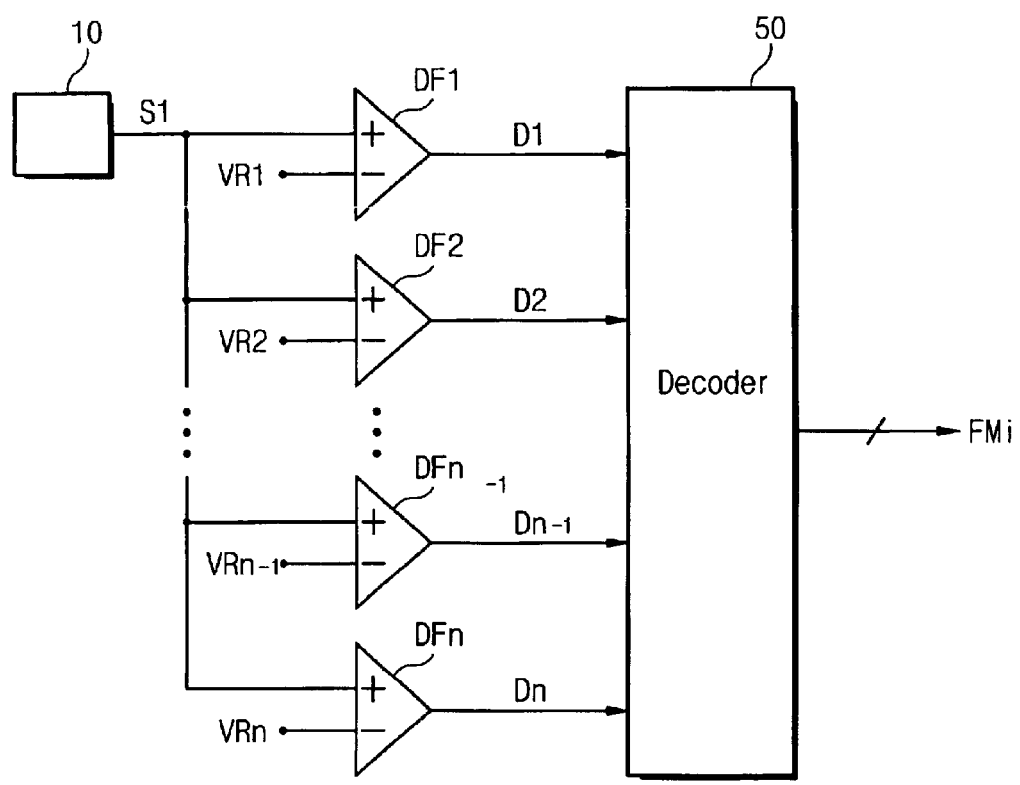
FIG. 7 is a block diagram of an operation mode setting circuit according to an embodiment of the present invention.
Figure 8:
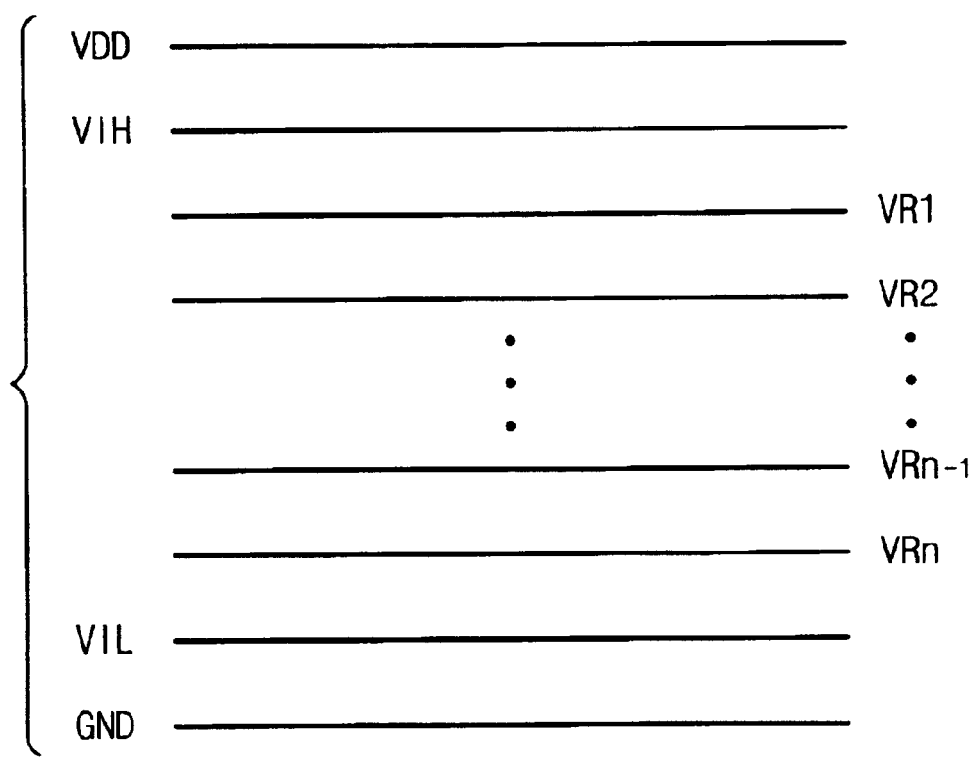
FIG. 8 is a state diagram illustrating voltage levels of reference voltages shown in FIG. 7.

According to an embodiment of the present invention, the functional mode setting circuit shown in FIG. 7 uses a method in which each of reference voltages VR1 to VRn (e.g., refer to FIG. 8) set between the minimum high level voltage VIH, less than VDD, and the maximum low level voltage VIL, greater than GND, are compared with the signal S1 input from a pin 10 and coding signals are generated. Here, the input signal S1 is a DC signal that has a constant voltage level. Referring to FIG. 7, the input signal S1 is simultaneously input to non-inverting input terminals (+) of differential amplifiers DF1 to DFn and compared with reference voltages VR1 to VRn. The differential amplifiers DF1 to DFn amplify the voltage difference between the corresponding reference voltage and input signal S1 and output the amplified signals D1 to Dn. The differential signals D1 to Dn are input to the decoder 50. The decoder 50 has a combination logic as shown in FIG. 6 and generates one or more functional mode signals FMi from the input differential signals D1 to Dn.

It will be apparent to those skilled in the art that various modifications and variations can be made in the present invention. Thus, it is intended that the present invention covers the modifications and variations of this invention provided they come within the scope of the appended claims and their equivalents.

As described above, mode setting DC pin installed in the conventional integrated circuit is used to set the functions for tests in a packaging stage. Accordingly, designers can set their desired functions without a separate available pin for setting functions.

What is claimed is:

1. An integrated circuit device comprising:
   a pin for receiving a direct current voltage-signal;
   a signal source for applying an alternating current voltage-signal to the pin;
   a buffer for converting the alternating current voltage-signal into a digital signal; and
   a digital detector for detecting a frequency of the digital signal and outputting a predetermined detection signal,
   wherein the predetermined detection signal is activated when the frequency, of the digital signal is greater than or equal to a predetermined frequency, and
   wherein the digital detector comprises a transistor for attenuating a component of the digital signal having a predetermined logic level when the digital signal is oscillated at a frequency greater than or equal to the predetermined frequency.

2. The device of claim 1, wherein the predetermined detection signal is a signal for setting predetermined functional modes.

3. The device of claim 1, further comprising:
   a register chain for generating successive transfer signals according to the digital signal in response to a clock signal; and
   a decoder for generating functional mode signals according to transfer signals in response to the predetermined detection signal.

4. The device of the claim 3, wherein register chain comprises registers for generating the transfer signals.

5. The device of claim 3, wherein the decoder generates the functional mode signals through a logical combination of the transfer signals.

6. The device of claim 1, wherein the digital detector comprises a plurality of inverter stages responsive to a reference signal.

7. The device of claim 6, wherein each inverter stage comprises:
   a PMOS transistor; and
   an NMOS transistor coupled in series to the PMOS transistor, the NMOS transistor having a size smaller than a size of the PMOS transistor.

8. The device of claim 7, wherein a functional mode signal depends on the size of the NMOS transistor for pull-down.

9. The device of claim 1, wherein a functional mode signal is activated when the frequency of the digital signal is greater than a predetermined minimum frequency.

10. The device of claim 9, wherein the predetermined minimum frequency depends on a size of an NMOS transistor relative to a PMOS transistor in an inverter stage of the digital detector.

11. An integrated circuit device comprising a pin for receiving a direct current voltage-signal, the device comprising:
   a signal source for applying an alternating current voltage-signal to the pin;
   a buffer for converting the alternating current voltage-signal into a digital signal; and
   a digital detector for detecting a frequency of the digital signal and outputting a predetermined detection signal;
   a register chain for generating successive transfer signals according to the digital signal in response to a clock signal; and
   a decoder for generating functional mode signals according to the transfer signals in response to the predetermined detection signal.

12. An integrated circuit device comprising a pin for receiving a direct current voltage-signal, the device comprising:
   a signal source for applying an alternating current voltage-signal to the pin;
   a buffer for converting the alternating current voltage-signal into a digital signal; and
   a digital detector for detecting a frequency of the digital signal and outputting a predetermined detection signal, wherein the digital detector comprises a plurality of inverter stages responsive to a reference signal.

13. The device of claim 12, wherein each inverter stage comprises:
   a PMOS transistor; and
   an NMOS transistor coupled in series to the PMOS transistor, the NMOS transistor having a size smaller than a size of the PMOS transistor.

14. The device of claim 13, wherein a functional mode signal depends on the size of the NMOS transistor for pull-down.

* * * * *